United States Patent [19]
Coleman et al.

[11] Patent Number: 5,947,021
[45] Date of Patent: Sep. 7, 1999

[54] METAL SQUEEGEE BLADE WITH A TITANIUM NITRIDE COATING

[75] Inventors: William E. Coleman; Matthew R. Richter, both of Colorado Springs, Colo.

[73] Assignee: Photo Stencil, Inc., Colorado Springs, Colo.

[21] Appl. No.: 08/963,735

[22] Filed: Nov. 4, 1997

[51] Int. Cl.$^6$ ..................................................... B41F 15/44
[52] U.S. Cl. ........................................... 101/120; 101/123
[58] Field of Search ..................... 101/129, 120, 101/123, 167, 169

[56] References Cited

U.S. PATENT DOCUMENTS

| | | | |
|---|---|---|---|
| 5,120,596 | 6/1992 | Yamada | 428/216 |
| 5,707,575 | 1/1998 | Litt et al. | 264/104 |
| 5,746,127 | 5/1998 | Fischbeck et al. | 101/123 |

FOREIGN PATENT DOCUMENTS

| | | |
|---|---|---|
| 3714327 | 11/1988 | Germany . |
| 63-116852 | 5/1988 | Japan . |
| 6-277608 | 10/1994 | Japan . |
| 9-254356 | 9/1997 | Japan . |

*Primary Examiner*—Edgar Burr
*Assistant Examiner*—Daniel J. Colilla
*Attorney, Agent, or Firm*—Choate, Hall & Stewart

[57] ABSTRACT

A squeegee blade comprising a base metal core coated with titanium nitride. Preferably, the blade also comprises a nickel coating between the base metal and the titanium nitride. The core blade is provided with an edge with a desired radius of curvature by chemical milling, and then the whole blade is chemically polished or electropolished and optionally nickel plated to produce a very smooth finish. The blade is then coated with titanium nitride to produce a blade with an extremely hard, low-friction surface. A squeegee incorporating the blade can be used, for example, for screen printing solder paste, conductive epoxy, or the like onto printed circuit boards.

4 Claims, 1 Drawing Sheet

U.S. Patent     Sep. 7, 1999     5,947,021

METAL SQUEEGEE BLADE WITH A TITANIUM NITRIDE COATING

FIELD OF THE INVENTION

This invention relates to screen printing, and more particularly to a squeegee blade for screen printing materials onto printed circuit boards.

BACKGROUND OF THE INVENTION

A problem often encountered in the surface mount electronics industry is that of accurately screen printing solder paste, conductive epoxies, and other materials onto printed circuit boards. This is typically done by placing an image stencil over the board, and then spreading viscous material (e.g., solder paste) over the surface of the stencil, forcing it through the stencil apertures and onto the circuit board below. The level of detail that can be produced by this process is controlled in part by the quality of the tool used to spread the material onto the stencil. The most common tool currently used for this purpose is a metal-bladed squeegee.

Conventional squeegee blades are typically made of carbon steel, stainless steel, or nickel. The life of carbon steel blades can be significantly shortened by corrosion in the aggressive environment of a solder paste printing system. Both types of steel can cause significant wear to stencils used for screen printing, resulting in high retooling costs when stencils are frequently replaced. Further, it can be relatively difficult to clean excess solder paste off of these types of blades after printing. Nickel plating or the use of nickel blades has been found to alleviate these problems somewhat by reducing the coefficient of friction of the squeegee blade, but corrosion, wear of blades and stencils, and cleaning difficulties are still obstacles to inexpensive, high-quality screen printing of solder pastes, conductive epoxies, and the like.

SUMMARY OF THE INVENTION

It is an object of the present invention to provide a squeegee blade which is hard enough to hold a very sharp edge, tough enough to last for many screen printing cycles, and has a sufficiently low-friction surface to glide smoothly over stencils containing finely detailed apertures, causing a minimum of wear to blade and stencil.

In one aspect, the invention comprises a squeegee blade comprising a base metal core, coated with titanium nitride. The blade most preferably has a radius of curvature at an edge of about 1–5 thousandths of an inch. This curvature can be produced, for example, by chemical milling. Preferably, before coating with titanium nitride, the blade is coated with nickel. In preferred embodiments, the base metal is an iron-nickel alloy, with a further preferred nickel content of about 42 weight percent. In other preferred embodiments, the nickel coating has a thickness of approximately 5 ten-thousandths of an inch, and the titanium nitride coating has a thickness of approximately 0.4 ten-thousandths of an inch (about one micron). The nickel coating may be applied by any coating process which generates a very smooth surface, for example electroless plating. A preferred method of applying the titanium nitride coating is by low temperature arc vapor deposition (LTAVD).

In another aspect, the invention comprises a method of producing a squeegee blade, comprising coating a sharp base metal blade with titanium nitride. In preferred embodiments, the base metal is an iron-nickel alloy, with a further preferred nickel content of about 42 weight percent. Before coating, the base metal blade may be sharpened by any suitable process, for example, chemical milling, chemical polishing, or electropolishing. It is preferred that the edge be sharpened to a radius of curvature of about 1–5 thousandths of an inch. At this point, a nickel coating may optionally be applied by any coating process which generates a very smooth surface, for example electroless plating. In preferred embodiments, the nickel coating has a thickness of about 5 ten-thousandths of an inch. The titanium coating may be applied by LTAVD. In preferred embodiments, the titanium nitride coating has a thickness of about 0.4 ten-thousandths of an inch (approximately one micron).

In yet another aspect, the invention comprises a method of screen printing a viscous material (e.g., solder paste or conductive epoxy) onto a printed circuit board. The printing is accomplished by placing a stencil comprising apertures in the shape of the desired printed pattern over the circuit board, and then by placing the viscous material on the stencil. The viscous material is then forced through the stencil into contact with the circuit board by pushing a squeegee over the surface of the board, the squeegee incorporating a blade comprising a base metal core, and a titanium nitride coating.

BRIEF DESCRIPTION OF THE DRAWING

The present invention is described with reference to the following Figures, which are presented for the purposes of illustration only and which are by no means intended to be limiting of the invention and in which.

DETAILED DESCRIPTION

A typical squeegee blade according to the invention is produced as follows. First, a base metal core squeegee blade is cut from rolled metal sheet stock. A preferred material for this core blade is an alloy consisting of 42% nickel, trace quantities of silicon, manganese, phosphorus, sulfur, and carbon, and the balance iron. An engineered edge is produced by chemically milling the edge of the blade to achieve an edge curvature that has been determined to be advantageous for the intended printing application of the blade. For the application of printing solder paste or conductive epoxy onto a printed circuit board, it has been found that an edge radius of curvature between 1 and 5 thousandths of an inch, and preferably of about 2 thousandths of an inch, produces good spreading of the solder paste or conductive epoxy onto the circuit board. In preferred embodiments, chemical milling is accomplished by spray impingement, but other possible techniques for forming the blade edge, such as electropolishing, will be apparent to one skilled in the art. The blade is then either chemically polished or electropolished to a smooth finish. The entire blade may then preferably be plated with nickel in a manner which preserves the smoothness of the finish. A particularly advantageous process for nickel coating has been found to be electroless plating. The nickel coating should be relatively thin, as its purpose is primarily to provide a smooth base to which titanium nitride can easily adhere. Finally, the blade is coated with titanium nitride. Current processes use low temperature arc vapor deposition to deposit the titanium nitride coating, but this coating could also be applied by high temperature sputtering or other well-known coating processes. The titanium nitride provides the blade with a hard outer surface with a low coefficient of friction.

Figure 1:
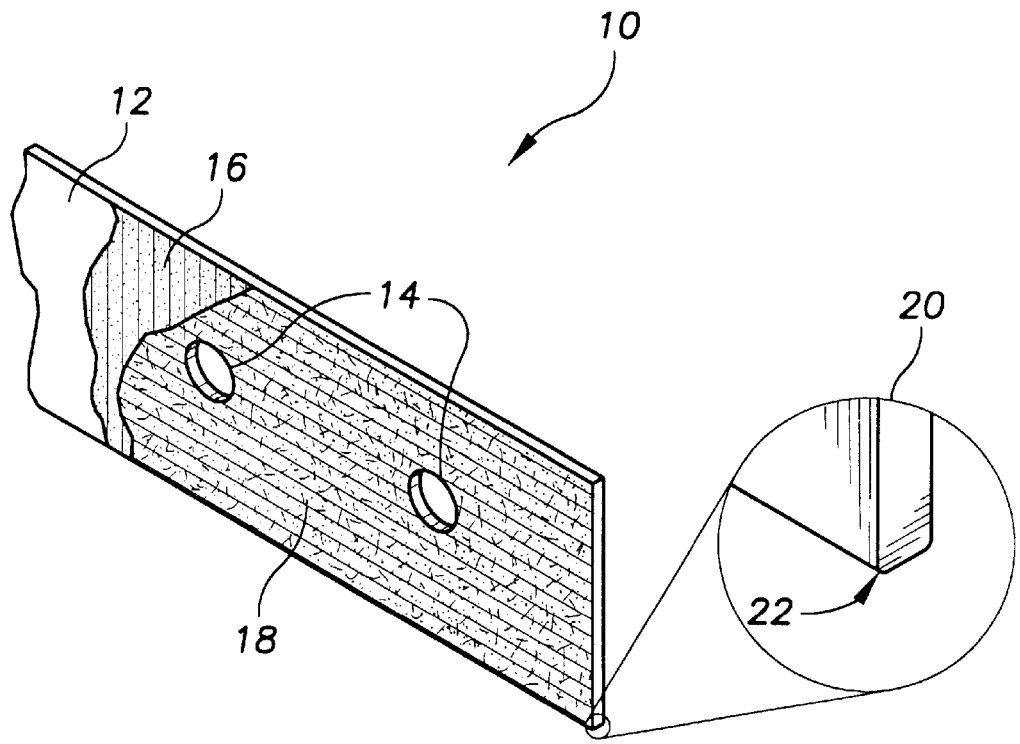
FIG. 1 depicts a squeegee blade manufactured according to the invention.

FIG. 1 of the drawing provides an illustration of a squeegee blade 10 produced according to the invention. The blade is shown in a cutaway fashion to illustrate the coating layers of the invention. A base metal blade 12 is provided with holes 14 to fit standard squeegee tooling. The blade further comprises an optional nickel coating 16, and a titanium nitride coating 18. Detail 20 shows the engineered radius of curvature 22 at the working edge of the blade.

Figure 2:
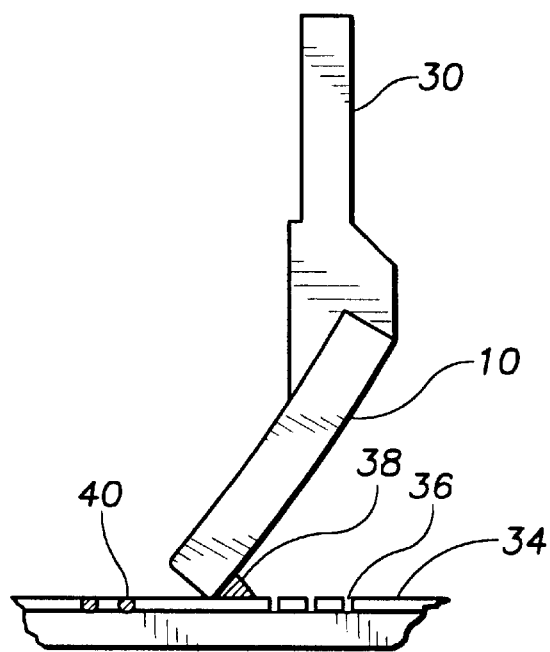
FIG. 2 depicts a squeegee incorporating a blade according to the invention being used to screen print solder paste onto a circuit board.

A squeegee blade made according to the invention can be used for screen printing solder paste, conductive epoxy, or the like onto a printed circuit board according to techniques well known in the art, and illustrated in FIG. 2 of the drawing. The interested reader may find descriptions of typical screen printing techniques in *Ball Grid Array and Fine Pitch Peripheral Interconnections*, Hwang (1995). Briefly, the squeegee blade 10 is inserted into squeegee tooling 30. The circuit board 32 is covered with a stencil 34 containing at least one aperture 36. Solder paste 38 or the like is spread over the stencil 34. The squeegee, comprising tooling 30 and blade 10, is then moved across the surface of the stencil 34, forcing the solder paste through the apertures 40. When the stencil 34 is removed, solder paste is left in the pattern formed by the apertures 40. It has been found that squeegee blades made according to the invention not only have useful lifetimes on the order of tens of thousands of printing cycles, but extend the lifetimes of stencils used for screen printing. Further, it has been found that it is easier to clean excess solder paste from these squeegee blades than from conventional steel or nickel blades.

EXAMPLE

This example describes the manufacture of a particular squeegee blade according to the technique of the invention.

A core squeegee blade was cut from 0.015"-thick rolled sheet stock of Alloy 42, an austenitic nickel-iron alloy, purchased from Hitachi Metals, Ltd., of Tokyo, Japan. The alloy composition was 42 wt % nickel, 0.005 wt % carbon, 0.15 wt % silicon, 0.45 wt % manganese, 0.005 wt % phosphorus, 0.002 wt % sulfur, 0.20 wt % cobalt, and the balance iron. This alloy has been found to be preferable to steel or nickel for the squeegee blades of the invention because it is more resistant to pitting during the chemical milling process than steel, and is harder than nickel. The core blade was cut as a 300 mm×30 mm rectangular piece, but typical blade sizes range from 76 to 550 mm in length, from 25 to 35 mm in width, and from 14 to 15 thousands of an inch in thickness.

A sharp edge with a radius of curvature of about 2 thousandths of an inch (22 of FIG. 1) was produced by photolithography and chemical milling. Standard photolithography techniques well-known to those skilled in the art were used to restrict the chemical milling to the extreme edge of the blade, allowing fine control over the radius of curvature. Chemical milling was accomplished by spraying a 42 Baumé solution of ferric chloride onto both sides of the blade. The solution contained approximately 33.5 wt % ferric chloride, and 1 wt % hydrochloric acid. Uniformity of edge curvature was assured by mounting the blade vertically on a vertical disk rotating about a horizontal axis to avoid pooling at the bottom of the blade.

Once the engineered edge described above had been produced and any remaining photoresist removed, the entire blade was subjected to an electroless nickel coating process. A nickel sulfate plating bath comprising a small quantity of sulfuric acid, composed of proprietary mixture NIKLAD™ 1000A purchased from MacDermid, Inc., of Waterbury, Conn., served as a source of nickel ions. This bath was heated to 190° C., and the blade was immersed in the bath for one hour. The resulting coating thickness was measured to be about 5 ten thousandths of an inch. This plating process provided a very smooth surface to the squeegee blade.

Finally, the blade was coated with titanium nitride by a standard LTAVD process. A titanium target and a striker for generating the arc were located above the blade, which was placed on a negative charge point. The bias charge on the blade was 75 V. The chamber was pumped down to a pressure of $5\times10^{-5}$ Torr, and purged with 1 mTorr argon gas and 4 mTorr nitrogen gas. The deposition system was then run at a current of about 120 amperes for 5 hours. The coating so deposited had a uniform thickness of about one micron (0.4 ten thousandths of an inch), providing the blade with a smooth, very hard, low-friction coating.

The squeegee blade so produced has a very hard, low-friction surface with an engineered edge curvature. Blades manufactured according to this technique have been found to produce lower screen printing defect rates than steel blades. Further, the lifetime of the nickel-plated steel stencil used in these experiments was extended, compared to typical lifetimes of comparable stencils used for screen printing with conventional squeegee blades.

Other embodiments of the invention will be apparent to those skilled in the art from a consideration of the specification or practice of the invention disclosed herein. It is intended that the specification and example be considered as exemplary only, with the true scope and spirit of the invention being indicated by the following claims.

What is claimed is:

1. A squeegee blade comprising:
   a base metal blade sized to fit into squeegee tooling, and comprising a sharp edge section;
   a continuous titanium nitride coating over the entire blade surface; and
   a nickel coating between the base metal blade and the titanium nitride coating.

2. The squeegee blade of claim 1, whereby the sharp edge section has a radius of curvature in the range of 1–5 thousandths of an inch.

3. The squeegee blade of claim 1, whereby the base metal blade comprises iron and nickel.

4. The squeegee blade of claim 3, whereby the nickel content of the blade is about 42 weight percent.

* * * * *